United States Patent
Guo et al.

(10) Patent No.: US 10,962,616 B2
(45) Date of Patent: Mar. 30, 2021

(54) METHOD AND APPARATUS FOR PROCESSING MR SIGNAL, AND COMPUTER PROGRAM

(71) Applicant: GE Precision Healthcare LLC, Wauwatosa, WI (US)

(72) Inventors: Jia Guo, Beijing (CN); Yongchuan Lai, Beijing (CN); Tongzhou Wang, Beijing (CN); Hongbin Wang, Beijing (CN)

(73) Assignee: GE PRECISION HEALTHCARE LLC, Wauwatosa, WI (US)

(*) Notice: Subject to any disclaimer, the term of this patent is extended or adjusted under 35 U.S.C. 154(b) by 169 days.

(21) Appl. No.: 16/020,656

(22) Filed: Jun. 27, 2018

(65) Prior Publication Data

US 2019/0004135 A1 Jan. 3, 2019

(30) Foreign Application Priority Data

Jun. 28, 2017 (CN) .......................... 201710509277.0

(51) Int. Cl.
| | |
|---|---|
| *G01R 33/561* | (2006.01) |
| *G01R 33/48* | (2006.01) |
| *G01R 33/00* | (2006.01) |
| *G06T 11/00* | (2006.01) |
| *G01R 33/58* | (2006.01) |
| *G01R 33/54* | (2006.01) |

(52) U.S. Cl.
CPC ......... *G01R 33/4826* (2013.01); *G01R 33/00* (2013.01); *G01R 33/583* (2013.01); *G06T 11/00* (2013.01); *G01R 33/543* (2013.01)

(58) Field of Classification Search
CPC ............ G01R 33/5611; G01R 33/4826; G01R 33/4816; G01R 33/482; G01R 33/4824; G01R 33/543; G01R 33/561
See application file for complete search history.

(56) References Cited

U.S. PATENT DOCUMENTS

| | | | |
|---|---|---|---|
| 10,073,159 B2* | 9/2018 | Kurokawa | ........... G01R 33/543 |
| 2014/0232395 A1* | 8/2014 | Sutton | .............. G01R 33/56358 324/309 |
| 2015/0260821 A1* | 9/2015 | Biber | ................... G01R 33/583 324/320 |
| 2016/0341806 A1* | 11/2016 | Smink | ................ G01R 33/4826 |
| 2017/0045598 A1* | 2/2017 | Takeshima | ......... G01R 33/5611 |

FOREIGN PATENT DOCUMENTS

WO 2016038048 A1 3/2016

* cited by examiner

*Primary Examiner* — Alesa Allgood
(74) *Attorney, Agent, or Firm* — Armstrong Teasdale LLP

(57) ABSTRACT

Methods and apparatuses for processing MR signal are disclosed herein. An exemplary method comprises: when acquired K-space signals are amplified, assigning a first amplification gain to signals within a first signal region in the K space, and assigning a second amplification gain to signals within a second signal region in the K space.

12 Claims, 5 Drawing Sheets

METHOD AND APPARATUS FOR PROCESSING MR SIGNAL, AND COMPUTER PROGRAM

FIELD

The present disclosure relates to a medical imaging field, particularly to a method and apparatus for processing magnetic resonance (MR) signals, and computer program for carrying out the method.

BACKGROUND

In the MR scanning imaging technology, it is common knowledge in the art to acquire MR signals based on K space. The acquired K-space signals need to be amplified via a radio frequency (RF) preamplifier, and then to be converted, via an analog/digital converting device, into digital signals for image reconstruction. Therefore, when pre-scanning is performed, amplification gains for the K-space signals need to be adjusted such that intensities of the K-space signals can be amplified to an appropriate extent.

Currently, a K-space model called "3D radial" has been applied in MR imaging. Such model is spherical, with intensities of signals in a central region close to the center of the model being far greater than intensities of signals in a region away from the center of the model. Therefore, in order to avoid excessively large amplification gain which might cause a high-intensity signal to be overly amplified to exceed a detection range of the analog/digital converting device, usually a lower amplification gain would be utilized to adapt to those high-intensity signals at the time of determining the amplification gain for the signals. However, when the lower amplification gain is utilized, signal-to-noise ratio (SNR) of the reconstructed image might be lower.

Accordingly, there is a need to provide with a new method and apparatus for processing MR signals, which can improve image quality.

SUMMARY

An objective of the present disclosure is to provide with a new method and apparatus for processing MR signals, which can improve image quality.

An exemplary embodiment of the present disclosure provides a method for processing MR signals, the method comprising: when acquired K-space signals are amplified, assigning a first amplification gain to signals within a first signal region in the K space, and assigning a second amplification gain to signals within a second signal region in the K space.

Another exemplary embodiment of the present disclosure provides a non-transitory computer readable media that stores a program, when executed by a magnetic resonance system, causing the magnetic resonance system to carry out a process comprising: when acquired K-space signals are amplified, assigning a first amplification gain to signals within a first signal region in the K space, and assigning a second amplification gain to signals within a second signal region in the K space.

Yet another exemplary embodiment of the present disclosure provides an apparatus for processing MR signals, the apparatus comprising a processor configured to assign a first amplification gain to signals within a first signal region in a K space and assign a second amplification gain to signals within a second signal region in the K space at the time of amplifying required K-space signals.

Other features and aspects will become apparent from the following detailed description, the drawings, and the claims.

BRIEF DESCRIPTION OF THE DRAWINGS

The disclosure may be better understood by the description of the exemplary embodiments of the present disclosure in conjunction with the accompanying drawings, in which.

DETAILED DESCRIPTION

In the following, specific embodiments of the present disclosure will be described. It should be noted that, in the detailed description of these embodiments, all features of the actual embodiments may not be described in detail for conciseness and simplicity of the description. It should be understood, in actual implementation of any one of the embodiments, just as in any one engineering project or designing project, in order to achieve the developers' specific goals and in order to meet system-related or business-related restrictions, a variety of concrete decisions are often made, which may vary from one implementation to another. In addition, it should also be understood, although the effort made in such developing process may be complex and time-consuming, some variations such as design, manufacture and production on the basis of the technical contents disclosed in the disclosure are just customary technical means in the art for one of ordinary skilled in the art associated with the contents disclosed in the present disclosure, which should not be regarded as insufficient disclosure of the present disclosure.

Unless otherwise defined, all technical or scientific terms used in the claims and the description should be interpreted in the ordinary sense to one of ordinary skills in the art to which this invention belongs. The terms "first", "second" and the like in the Description and the Claims of the present application for invention do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

The method and apparatus for processing MR signals according to embodiments of the present disclosure are used in an MR scanning system, which process the MR signals generated from scanning based on a K-space data acquisition model.

Figure 1:
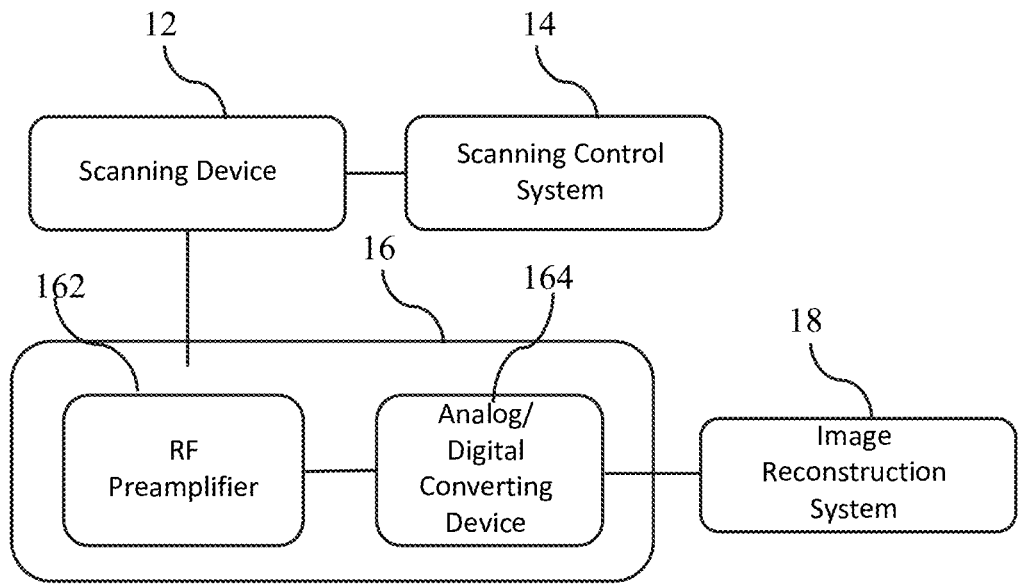
FIG. 1 is a structural schematic diagram of an MR scanning system of an embodiment in the prior art.

FIG. 1 is a structural schematic diagram of an MR scanning system of an embodiment in the prior art. As shown in FIG. 1, the MR scanning system comprises a scanning device 12, a scanning control system 14, a signal processing system 16 and an image reconstruction system 18.

The scanning device 12 comprises a magnet for generating a static magnetic field, an RF emitting coil for generating excitation RF pulses, a gradient coil for generating a gradient magnetic field and an RF receiving coil for receiving MR signals.

The scanning control system 14 is configured to control the components in the scanning device 12 in accordance with a specific pulse sequence to perform scanning on the scanned object. Based on the specific pulse sequence, the MR signals generated from excitation of the scanned object may be acquired by the RF receiving coil in a K-space data acquisition model.

The signal processing system 16 comprises an RF pre-amplifier 162 and an analog/digital converting device 164. The RF preamplifier 162 is configured to amplify the MR signals acquired by the RF receiving coil. The analog/digital converting device 164 is configured to convert the amplified signals into digital signals.

The image reconstruction system 18 performs image reconstruction based on the digital signals.

Figure 2:
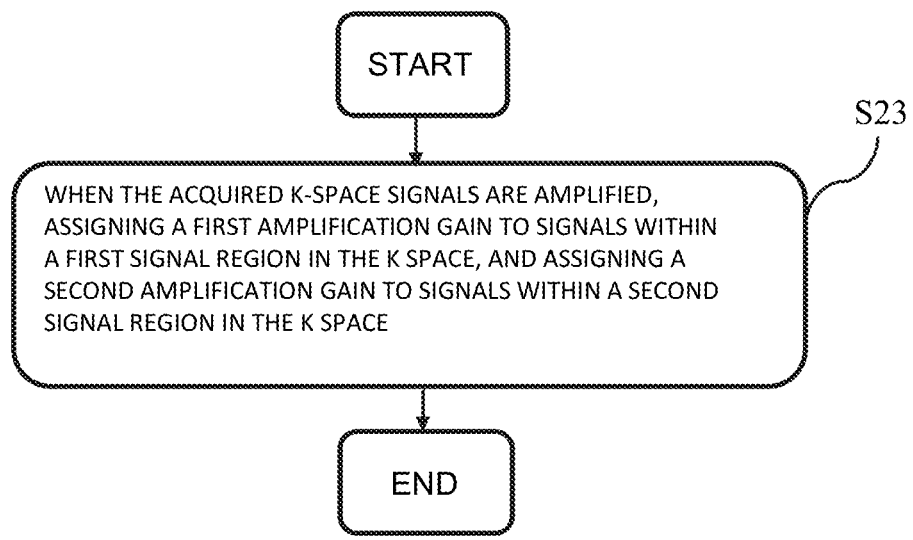
FIG. 2 is a flow chart of a method for processing MR signals according to an exemplary embodiment of the present disclosure.

FIG. 2 is a flow chart of a method for processing MR signals according to an exemplary embodiment of the present disclosure. As shown in FIG. 2, the method comprises an operation S23. In the operation S23, when the acquired K-space signals are amplified, a first amplification gain is assigned to signals within a first signal region in the K space, and a second amplification gain is assigned to signals within a second signal region in the K space. After the first signal region and the second signal region are assigned with respective amplification gains, the RF preamplifier in the MR scanning system can then amplify the signals in the first signal region and the second signal region respectively according to the corresponding amplification gains.

By the above manner, when the MR signals are amplified, signals of different regions can flexibly be amplified by different times respectively, thus avoiding reduced SNR or an amplification exceeding the scope due to usage of the same amplification gain, which can improve the image quality.

Furthermore, the signal intensity in the first signal region is greater than the signal intensity in the second signal region, and the first amplification gain is lower than the second amplification gain. In this way, for MR signals of greater signal intensity, a lower amplification gain is utilized to avoid excessive amplification that cannot be detected, while for MR signals of less signal intensity, a higher amplification gain is utilized so that the MR signals can be amplified sufficiently so as to have a higher resolution when the analog/digital conversion is performed, and in turn, the SNR of the reconstructed image is increased correspondingly.

Figure 3:
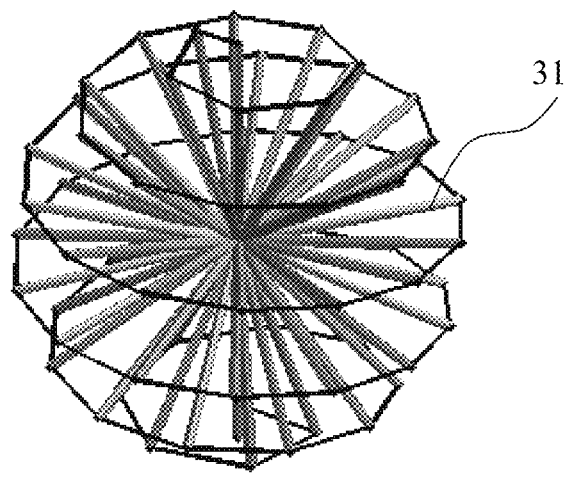
FIG. 3 is a structural diagram of a K-space model according to an exemplary embodiment of the present disclosure.

FIG. 3 is a structural diagram of a K-space model according to an exemplary embodiment of the present disclosure. As shown in FIG. 3, in one embodiment, the K space is a spherical signal space in which a data acquisition trajectory is a radiation radius 31 with the center of the K space being the starting point. Based on such K-space data model, as the center of the K space (a position at which the frequency coordinate of the K space $K_X$, $K_Y$ and $K_Z$ are all zero, center of sphere of the spherical signal space) is always used as the starting point, each radiation radius 31 having the same length.

The above first signal region is specifically a central region of the K space, e.g., a region in which a distance between the coordinate of a K-space signal and the center of the K space is less than or equal to a specific value. The second signal region is a region outside the center region, i.e., a region in which a distance between the coordinate of a K-space signal and the center of the K space is greater than the specific value.

The above specific value, as well as the first signal region and the second signal region divided in accordance with the specific value may be determined according to intensity distribution information of the K-space signals, which will be set forth in details combining with FIG. 4 below.

Figure 4:
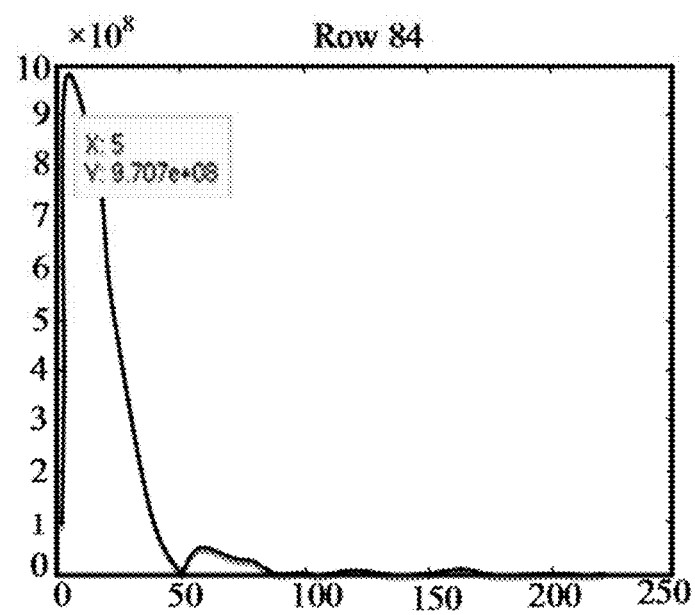
FIG. 4 is a curve graph of self-induction attenuation signals obtained along a data acquisition trajectory of the K space according to an embodiment of the present disclosure.

FIG. 4 is a curve graph of self-induction attenuation signals (i.e., MR signals) obtained along a data acquisition trajectory of the K space according to an exemplary embodiment of the present invention. The horizontal axis of the curve graph corresponds to frequency coordinates of the data acquisition trajectory in the K space, and the vertical axis of the curve graph corresponds to signal intensities of the self-induced attenuation signals. As shown in FIG. 4, the closer the signal is to the center of the K space (point of zero in FIG. 4), the greater the signal intensity is, and vice versa.

Accordingly, a region with higher signal intensities may be determined as the first signal region, and a region with lower signal intensities may be determined as the second signal region. For example, according to signal intensity distribution information on one or more data acquisition trajectories, if, per analysis, signal intensities in a region with coordinate values less than or equal to a specific value (e.g., a coordinate value of 40) are greater, then said region may be determined as the first signal region and the first amplification gain may be assigned thereto.

Figure 5:
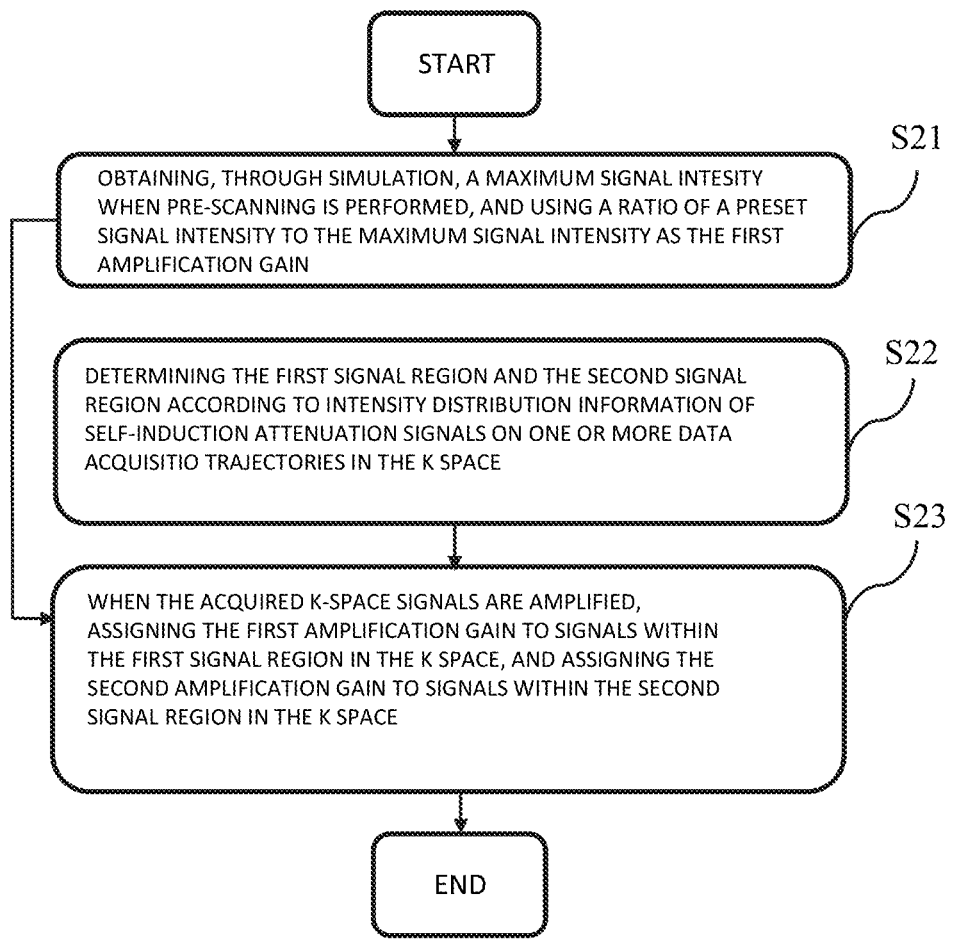
FIG. 5 is a flow chart of a system for processing MR signals according to another exemplary embodiment of the present disclosure.

FIG. 5 is a flow chart of a system for processing MR signals according to another exemplary embodiment of the present disclosure. As shown in FIG. 5, before the operation S23, the following operation S22 may also be included: determining the first signal region and the second signal region according to intensity distribution information of self-induction attenuation signals on one or more data acquisition trajectories in the K space.

As shown in FIG. 5, optionally, in order to obtain an appropriate first amplification gain, the following operation S21 may also be included before the operation S23: obtaining through simulation, a maximum signal intensity when a pre-scanning is performed, and using a ratio of a preset signal intensity to the maximum signal intensity as the first amplification gain.

The method for simulation may be, for example, continuously acquiring signals at the center of the K space by adjusting the gradient values during a preset period, and determining the maximum signal intensity among those signals. Or, the method may be switching off, reversing and restoring pulses so as to make the original magnetization vector greater than the actual filling signal of the K space to obtain the maximum signal intensity.

The above preset signal intensity may be determined according to the signal detection range of the analog/digital converting device. For example, the preset signal intensity may be the maximum value within the signal detection range of the analog/digital converting device.

The exemplary embodiments of the present disclosure may also provide a computer program, when running in an MR scanning system, adapting the MR scanning system to carry out the method for processing MR signals of the above embodiments. The person skilled in the art should understand that the present invention may also provide with a medium for storing said computer program.

Figure 6:
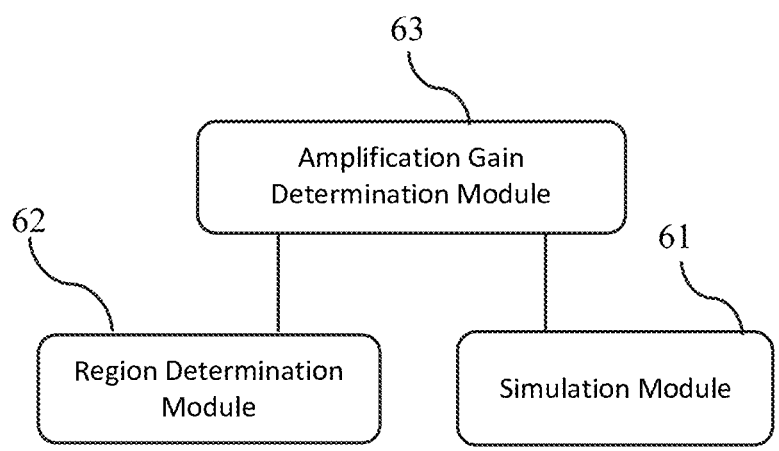
FIG. 6 illustrates a block diagram of an apparatus for processing MR signals according to an exemplary embodiment of the present invention.

FIG. 6 illustrates a block diagram of an apparatus for processing MR signals according to an exemplary embodiment of the present disclosure. As shown in FIG. 6, the apparatus for processing MR signals comprises an amplification gain determination module 63 for determining an amplification gain of an RF preamplifier of an MR scanning system, wherein the amplification gain determination module 63 is configured to assign a first amplification gain to signals within a first signal region in a K space and assign a second amplification gain to signals within a second signal region in the K space.

Furthermore, the signal intensities in the first signal region are greater than the signal intensities in the second signal region, and the first amplification gain is lower than the second amplification gain.

Furthermore, the above K space is a spherical signal space in which a data acquisition trajectory is a radiation radius 31 with the center of the K space being a starting point. The first signal region is a region in which a distance between the coordinate of a K-space signal and the center of the K space is less than or equal to a specific value, and the second signal region is a region in which a distance between the coordinate of a K-space signal and the center of the K space is greater than the specific value.

Furthermore, the apparatus for processing MR signals of the present invention may further comprise a region determination module 62 for determining the first signal region and the second signal region according to intensity distribution information of self-induction attenuation signals on each data acquisition trajectory in the K space.

Furthermore, the apparatus for processing MR signals of the present invention may further comprise a simulation module 61 for obtaining a maximum signal intensity when a pre-scanning is performed. The amplification gain determination module 63 is further configured to use a ratio of a preset signal intensity to the maximum signal intensity as the first amplification gain.

In the embodiments of the present disclosure, the practice of assigning the same amplification gain to the signals of the whole K space in the prior art has been abandoned. By assigning different amplification gains to the signals in different regions of the K space so as to be adaptable to signal intensities of different regions, not only the problem of image blurring caused by excessively amplifying the high-intensity signals can be avoided, but also the problem of low SNR caused by insufficiently amplifying the low-intensity signals can be avoided, thus the image quality can get improved.

Figure 7:
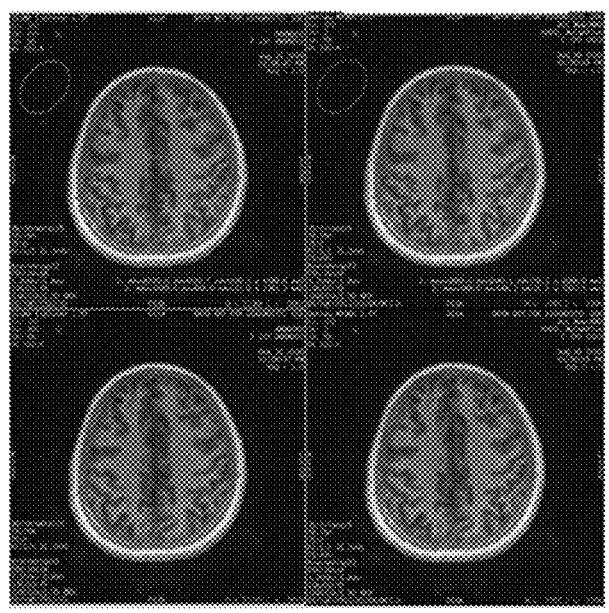
FIG. 7 and FIG. 8 both are figures comparing reconstruction images obtained by adopting the method for processing MR signals according to embodiments of the present disclosure and reconstruction images obtained by adopting the prior art.
Figure 8:
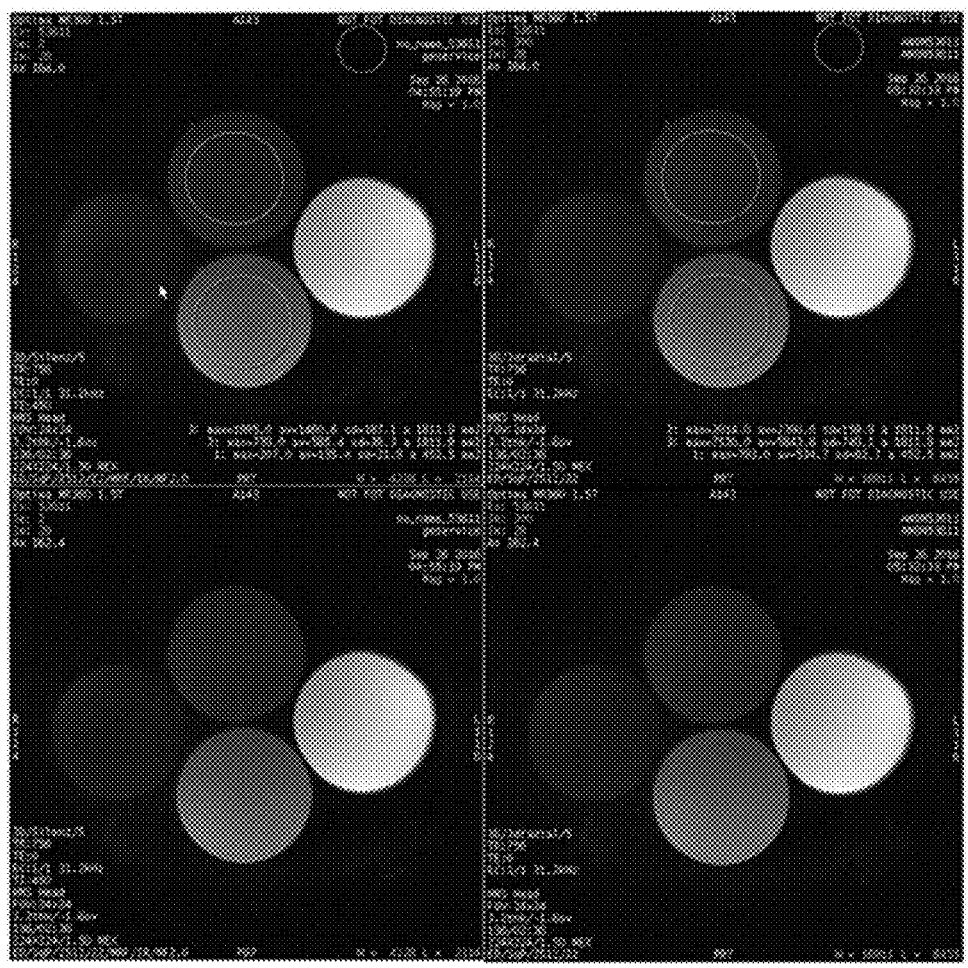

FIG. 7 and FIG. 8 both are figures comparing reconstruction images obtained by adopting the method for processing MR signals according to embodiments of the present disclosure and reconstruction images obtained by adopting the prior art, in which the left side of FIGS. 7 and 8 are reconstruction images obtained by adopting embodiments of the present disclosure, and the right side of FIGS. 7 and 8 are reconstruction images obtained by adopting the prior art. For the MR signals corresponding to the left-side images of FIGS. 7 and 8, a variable amplification gain is utilized, i.e., with a lower amplification gain for the signals in the central region of the K space and with a higher amplification gain for the signals in the peripheral region. While for the MR signals corresponding to the right-side images of FIGS. 7 and 8, a lower amplification gain is utilized for all the regions of the K space. In FIG. 7, the SNR of the right-side image is 33.55, and the SNR of the left-side image is 33.61, which has increased compared with the right-side image. In FIG. 8, the SNR of the right-side image is 26.7, and the SNR of the left-side image is 28.9, which has increased significantly compared with the right image.

Some exemplary embodiments have been described above, however, it should be understood that various modifications may be made. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other implementations also fall within the protection scope of the Claims.

What is claimed is:

1. A method for processing MR signals, the method comprising:
when acquired K-space signals are amplified, assigning a first amplification gain to signals within a first signal region in the K space, and assigning a second amplification gain to signals within a second signal region in the K space, wherein signal intensities of K-space signals in the first signal region are greater than signal intensities of K-space signals in the second signal region, and wherein the first amplification gain is lower than the second amplification gain.

2. The method for processing MR signals of claim 1, further comprising:
obtaining, through simulation, a maximum signal intensity of the K-space signals acquired when a pre-scanning is performed;
using a ratio of a preset signal intensity of the K-space signals to the maximum signal intensity of the K-space signals as the first amplification gain.

3. The method of claim 1, wherein the K space is a spherical signal space in which a data acquisition trajectory is a radiation radius with a center of the K space being a starting point, the first signal region is a region in which a distance between a coordinate of any K-space signal and the center of the K space is less than or equal to a specific value, and the second signal region is a region in which a distance between a coordinate of any K-space signal and the center of the K space is greater than the specific value.

4. The method of claim 3, further comprising:
determining the first signal region and the second signal region according to intensity distribution information of self-induction attenuation signals of the K-space signals on one or more data acquisition trajectory in the K space, wherein the first signal region includes higher signal intensities of the K-space signals than the signal intensities of the K-space signals of the second signal region.

5. A non-transitory computer readable media that stores a program, when executed by a magnetic resonance system, causing the magnetic resonance system to carry out a process comprising:

when acquired K-space signals are amplified, assigning a first amplification gain to signals within a first signal region in the K space, and assigning a second amplification gain to signals within a second signal region in the K space, wherein signal intensities of K-space signals in the first signal region are greater than signal intensities of K-space signals in the second signal region, and wherein the first amplification gain is lower than the second amplification gain.

6. The non-transitory computer readable media of claim 5, wherein the program further causes the MR scanning system to:
   obtain, through simulation, a maximum signal intensity of the K-space signals acquired when a pre-scanning is performed; and
   use a ratio of a preset signal intensity of the K-space signals to the maximum signal intensity of the K-space signals as the first amplification gain.

7. The non-transitory computer readable media of claim 5, wherein the K space is a spherical signal space in which a data acquisition trajectory is a radiation radius with a center of the K space being a starting point, the first signal region is a region in which a distance between a coordinate of any K-space signal and the center of the K space is less than or equal to a specific value, and the second signal region is a region in which a distance between a coordinate of any K-space signal and the center of the K space is greater than the specific value.

8. The non-transitory computer readable media of claim 7, wherein the program further causes the MR scanning system to:
   determine the first signal region and the second signal region according to intensity distribution information of self-induction attenuation signals of the K-space signals on one or more data acquisition trajectory in the K space, wherein the first signal region includes higher signal intensities of the K-space signals than the signal intensities of the K-space signals of the second signal region.

9. An apparatus for processing MR signals, the apparatus comprising:
   a processor configured to assign a first amplification gain to signals within a first signal region in a K space and assign a second amplification gain to signals within a second signal region in the K space at the time of amplifying required K-space signals, wherein signal intensities of K-space signals in the first signal region are greater than signal intensities of K-space signals in the second signal region, and wherein the first amplification gain is lower than the second amplification gain.

10. The apparatus of claim 9, wherein the processor is further configured to obtain a maximum signal intensity of the K-space signals acquired when a pre-scanning is preformed, and to use a ratio of a preset signal intensity of the K-space signals to the maximum signal intensity of the K-space signals as the first amplification gain.

11. The apparatus of claim 9, wherein the K space is a spherical signal space in which a data acquisition trajectory is a radiation radius with a center of the K space being a starting point, the first signal region includes a region in which a distance between a coordinate of any K-space signal and the center of the K space is less than or equal to a specific value, and the second signal region is a region in which a distance between a coordinate of any K-space signal and the center of the K space is greater than the specific value.

12. The apparatus of claim 11, wherein the processor is further configured to determine the first signal region and the second signal region according to intensity distribution information of self-induction attenuation signals of the K-space signals on one or more data acquisition trajectory in the K space, wherein the first signal region includes higher signal intensities of the K-space signals than the signal intensities of the K-space signals of the second signal region.

\* \* \* \* \*